United States Patent [19]

Maejima et al.

[11] Patent Number: 4,875,434
[45] Date of Patent: Oct. 24, 1989

[54] APPARATUS FOR COATING A SUBSTRATE WITH A COATING MATERIAL

[75] Inventors: Taro Maejima; Toshio Yada; Michinari Tsutsumi; Tsuyoshi Tabuchi; Takeshi Terazono; Masaru Aoki, all of Amagasaki City, Japan

[73] Assignee: Mitsubishi Denki Kabushiki Kaisha, Japan

[21] Appl. No.: 176,864

[22] Filed: Apr. 1, 1988

[30] Foreign Application Priority Data

Apr. 2, 1987 [JP] Japan .................. 62-82109
Apr. 20, 1987 [JP] Japan .................. 62-59814

[51] Int. Cl.$^4$ ............... B05C 1/02; B05C 3/09; B05C 7/06
[52] U.S. Cl. ................... 118/52; 118/107; 118/110; 118/112; 118/206; 118/232
[58] Field of Search .......... 118/56, 218, 600, 230, 118/232, 244, 258, 414, 500, 50, 52, 107, 110, 111, 112, 206, ; 279/1 C; 427/428, 240

[56] References Cited

U.S. PATENT DOCUMENTS

| | | | |
|---|---|---|---|
| 3,577,267 | 5/1971 | Preston et al. | 427/240 |
| 3,993,018 | 11/1976 | Kranik et al. | 118/52 |
| 4,286,541 | 9/1981 | Blackwood | 118/52 |
| 4,385,083 | 5/1983 | Shelley | 118/52 |
| 4,640,846 | 2/1987 | Kuo | 118/52 |
| 4,677,758 | 7/1987 | Aigo | 279/1 C |
| 4,700,595 | 10/1987 | Soares | 279/1 C |
| 4,791,880 | 12/1988 | Aigo | 118/52 |

FOREIGN PATENT DOCUMENTS 2713489 9/1978 Fed. Rep. of Germany ...... 118/232
0665951 6/1979 U.S.S.R. .
0939123 7/1982 U.S.S.R. .................. 118/52

OTHER PUBLICATIONS

Applied Physics, vol. 54, No. 2, 1985, pp. 131–132.
Three page excerpt from sales brochure of Headway Research, Inc. Garland, Texas, for photoresist spinners, etc.

*Primary Examiner*—Willard Hoag
*Attorney, Agent, or Firm*—Leydig, Voit & Mayer

[57] ABSTRACT

An apparatus for coating the flat surface of a substrate with a coating material is disclosed in which only a minimum amount of coating material is required for uniformly coating the entire surface of the substrate in an efficient manner under a variety of coating conditions, even if the substrate surface takes a non-circular configuration. According to one embodiment, the flat surface of the substrate is first coated with a coating material, and the substrate thus coated is then spunned at predetermined number of revolutions per minute. According to another embodiment, the apparatus includes a support table on which the substrate is fixedly mounted. A plurality of shaping members are slidably mounted on the support table for forming with the flat non-circular-shaped surface of the substrate a flat continuously extending circular-shaped surface. A plurality of biasing members are provided one for each shaping member for biasing the shaping members radially inwards into intimate contact at their inner sides with the peripheral side surfaces of the substrate mounted on the support table. A plurality of level adjusting mechanisms are provided on the shaping members for adjusting the surface of the shaping members to be flush with the flat surface of the substrate.

7 Claims, 2 Drawing Sheets

APPARATUS FOR COATING A SUBSTRATE WITH A COATING MATERIAL

BACKGROUND OF THE INVENTION

1. Field of the Invention

The present invention relates to a method and an apparatus for applying a coating material such as a photoresist on a flat surface of a substrate such as a semiconductor wafer in a uniform and efficient manner.

2. Description of the Prior Art

As the technology of electronics has advanced in recent years, various kinds of semiconductor devices have been developed which have substrates formed of varying materials and having various shapes, beside the conventional circular-shaped substrates such as silicon wafers. The demand for fine and miniaturized semiconductor devices becomes stronger and stronger year by year. At the present time, it is the common, keen interest of many persons who are concerned with research and development in semiconductor devices to apply a coating material to substrates of varying materials and configurations in a uniform and effective manner.

In the past, in a typical process for producing LSI circuits, a spincoating method is employed for coating a photoresist on a semiconductor substrate. The technique is described, for example, in "Applied Physics", Volume 54 No. 2, issued in 1985, on pages 131 and 132. The a spincoating method is highly efficient and able to provide a uniform coating on circular-shaped substrates. A photoresist is caused to concentrically spread outwards from its center in radial directions under the action of centrifugal forces. However, when such a spincoating method is applied to rectangular, polygonal, or non-circular-shaped substrates, which have been developed for particular use with TFT LCDs (then film transistor liquid crystal flat displays), contact-type image sensors, and the like in recent years, a large amount of photoresist must be dropped onto the surface of a substrate will coat to ensure that the photoresist can be coated on the entire surface of the substrate, including every corner thereof. This results in a substantial increase in the production cost. Moreover, it is difficult to uniformly coat the photoresist on the entire surface of a non-circular-shaped substrate by spincoating since the photoresist coat tends to become much thicker at the corner portions than at the central portion.

In order to solve this problem, it was proposed that a support table or chuck 2 for supporting a substrate thereon with vacuum be constructed in the manner as shown in FIGS. 1 and 2 (see a brochure issued by Headway Research, Inc., Part Nos. 1–4933 through 4935, 1–8088, 1–7567 and 1–7399). Specifically, the support table 2 is formed with a recess 3 having a shape conforming to that of a substrate 1. In this case, the substrate 1 is of a square shape and the recess 3 in the support table 2 also takes the form of a square which is slightly larger than the substrate 1. The substrate 1 can fit into the recess 3 with its surface flush with the upper surface of the support. In this way, the square surface of the substrate 1 cooperates with the upper surface of the support table 2 to form a circular-shaped, extended flat surface, whereby the entire surface of the square-shaped substrate 1 including every corner thereof can be coated with a coating material in an economical manner by the spincoating method.

In this solution, however, it is necessary to form the recess 3 in the support table 2 larger in size than the substrate 1 to accommodate tolerances or manufacturing errors occurring in the course of production. The clearances are necessarily provided between the four side edges of the square substrate 1 and the corresponding inner side surfaces of the recessed portion 3 in the support table 2. Accordingly, it is very difficult to apply a coating material on the entire surface of the square or non-circular substrate 1 with a uniform thickness except under certain specific conditions such as a predetermined limited range of rpms of the support table 2 and a predetermined limited range of viscosity of the coating material.

On the other hand, there is another conventional method for applying a photoresist on a substrate having an arbitrary configuration, which uses a roll coater. This method requires only a minimum amount of photoresist and hence is very economical. The method has the disadvantage that the surface of the photoresist coating thus applied includes fine concave and convex patterns pressed thereon due to the surface irregularities of the rollers employed.

Accordingly, among the conventional coating methods as described above, the spincoating method is most advantageous from the view point of fine processings on the surface of a substrate as more and more required in recent years. However, the spin-coating method is disadvantageous in that a large amount of photoresist is required for uniformly coating the entire surface of a substrate including corner portions thereof if the surface of the substrate is of a non-circular shape such as a rectangle, a polygon or the like.

SUMMARY OF THE INVENTION

In view of the above, the present invention is intended to obviate the above-described problems of the prior art.

An object of the present invention is to provide a method and an apparatus for coating the flat surface of a substrate with a coating material in which only a minimum amount of coating material is required for uniformly coating the entire surface of the substrate even if the substrate surface has a non-circular configuration.

Another object of the present invention is to provide a method and an apparatus for coating the flat surface of a substrate with a coating material in which the entire surface of a substrate having a non-circular configuration can be uniformly coated with a coating material in a most efficient manner under a wide variety of coating conditions.

In order to achieve the above objects, according to one aspect of the present invention, there is provided a method for coating a substrate with a coating material, the substrate having a flat surface, the method comprising:

a first step of coating the flat surface of the substrate with a coating material; and a second step of spinning the substrate thus coated at predetermined number of revolutions per minute.

According to another aspect of the present invention, there is provided an apparatus for coating a substrate with a coating material, the substrate having a flat surface, the apparatus comprising:

a roll coater for coating the flat surface of the substrate with the coating material by means of a roller; and a spincoater for spincoating the flat surface of the substrate thus roll coated.

According to a further aspect of the present invention, there is provided an apparatus for coating a substrate with a coating material, the substrate having a flat non-circular-shaped surface, the apparatus comprising:

a support table;

a mounting means for fixedly mounting the substrate on the support table;

a drive means for driving the support table to rotate;

a plurality of shaping members slidably mounted on the support table for changing the shape of non-circular-shaped substrates into a flat continuously extending circular-shaped surface during coating;

a plurality of biasing means provided one for each shaping member for biasing the shaping members radially inwards into intimate contact at their inner sides with the peripheral side surfaces of the substrate to clamp the substrate on the support table; and a plurality of level adjusting means provided on the shaping members for adjusting the positions of the shaping members so that they are flush with the flat surface of the substrate. The above and other objects, features and advantages of the present invention will become apparent from the following detailed description of a few preferred embodiments of the invention when taken in conjunction with the accompanying drawings.

DESCRIPTION OF THE PREFERRED EMBODIMENTS

The present invention will now be described in detail with reference to a few preferred embodiments thereof as illustrated in the accompanying drawings.

Figure 3:
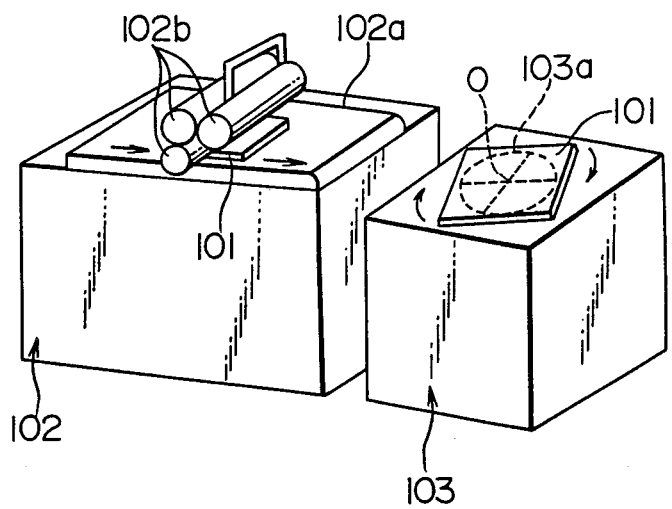
FIG. 3 is a perspective view of a coating apparatus as used in a coating method in accordance with one embodiment of the present invention.

Referring to the drawings and first to FIG. 3, there is shown an apparatus for coating a substrate with a coating material as used in a coating method in accordance with a first embodiment of the present invention. First, a plate-like substrate 101, such as a semiconductor substrate having an arbitrary configuration (a rectangle in this embodiment), is prepared. Substrate 101 has been subjected to a pretreatment in a predetermined known way to improve the adhesiveness of a coating material to be applied to the surface of the substrate 101. Then, the entire flat surface of the substrate 101 is substantially uniformly coated with the coating material, such as a photosensitive resin, by means of a roll coater 102, of a known construction including a table 102a and a plurality of rollers 102b. Specifically, the plate-like substrate 101 is passed through one (i.e., a presser roller) of the rollers 102b and the surface of the table 102a, as indicated by straight arrows in FIG. 3, and coated with the coating material by the roller 102b contacting it. Subsequently, the substrate 101 thus roll coated is swiftly transferred to and mounted on a conventional spincoater 103, of a known construction, including a circular-shaped support member or table 103a having a flat mounting surface, the table 103a being rotated by an unillustrated motor. With the substrate 101 fixedly mounted on the surface of the table 103a and with its center placed in coincidence with a rotation axis 0 of the table 103a, the spincoater 103 is operated to rotate the support table 103a, as indicated by curved arrows in FIG. 3, to spincoat the surface of the substrate 101. Substrate 101 thus mounted at a certain rotational speed or rpm which gives a desired thickness of a coating. Thereafter, the substrate 101 thus spincoated is subjected to a photolithographic process such as a prebaking process.

Figure 1:
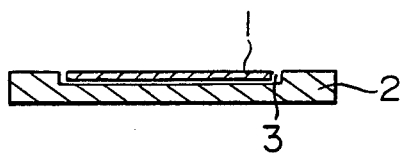
FIG. 1 is a cross sectional view taken on line I—I of FIG. 2, showing a conventional coating apparatus as used in a prior art coating method.
Figure 2:
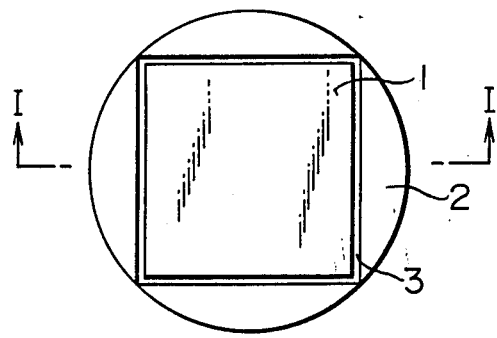
FIG. 2 is a plan view of the apparatus shown in FIG. 1.

It is to be noted that in this embodiment, the thickness, material and configuration of the plate-like substrate 101 can be selected arbitrarily. Further, when the substrate 101 is spincoated after having been roll coated, any fine irregularities or concave and convex patterns on the surface of the substrate 101, which would be formed by the presser roller 102b of the roll coater 102 during the roll coating, can be substantially smoothed and eliminated to provide a uniform coating over the entire surface of the substrate 101, including every corner. Furthermore, in roll coating, it is sufficient to supply a minimum amount of coating material onto the surface of the substrate 101, and therefore the whole coating process of the present invention is very economical as compared with the conventional spincoating process illustrated in FIGS. 1 and 2.

Figure 4:
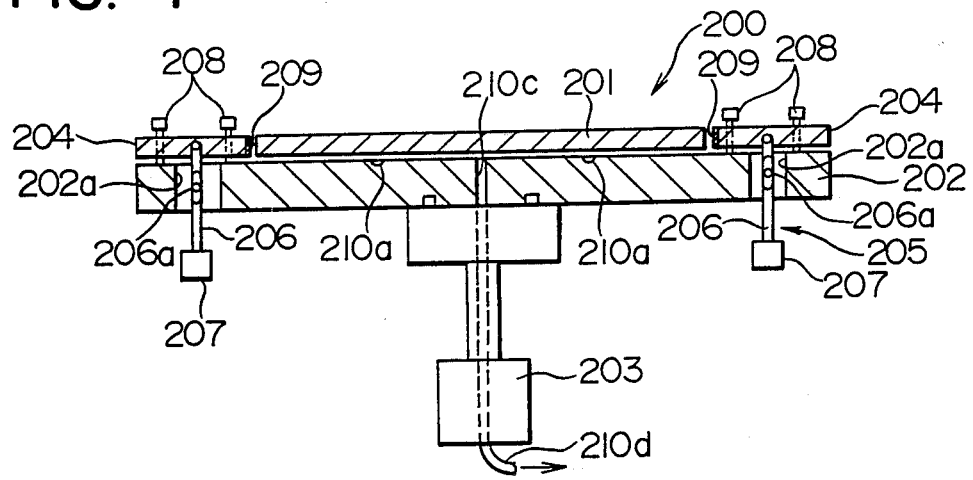
FIG. 4 is a cross sectional view taken on line IV—IV of FIG. 5, showing a coating apparatus in accordance with another embodiment of the present invention.
Figure 5:
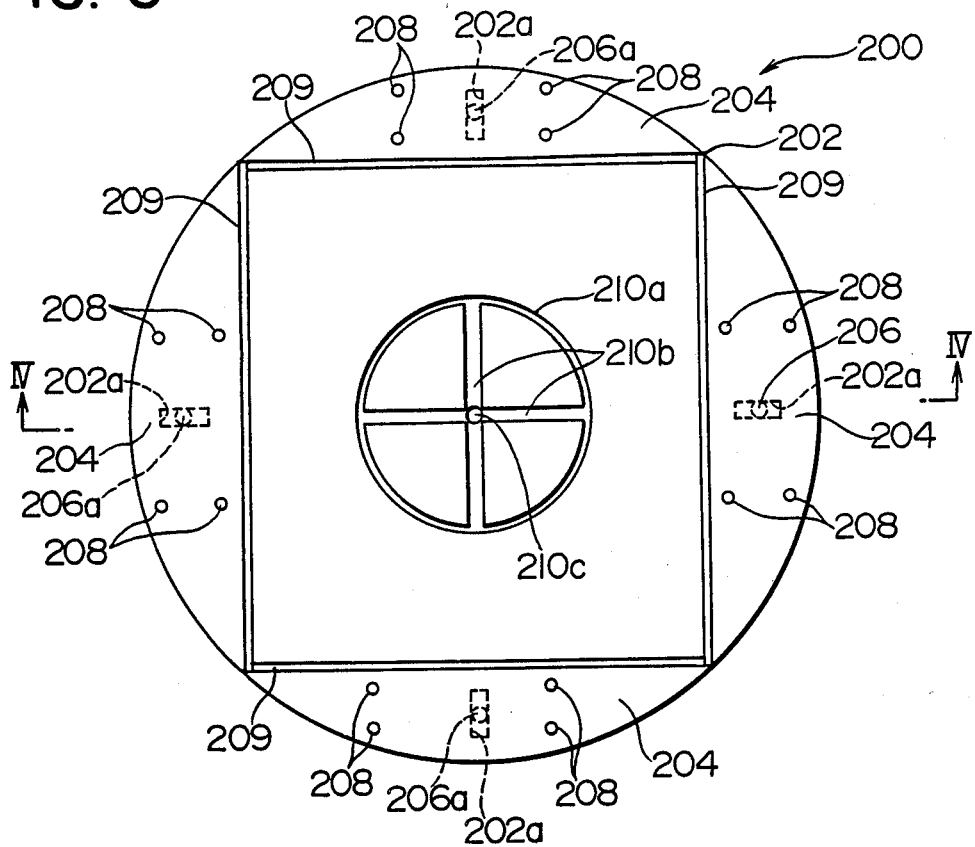
FIG. 5 is a plan view of the coating apparatus illustrated in FIG. 4.

FIGS. 4 and 5 show another embodiment of the present invention. In this embodiment, a spincoater 200 alone is employed for spincoating the surface of a substrate 201 having a non-circular configuration, for example a square in the illustrated embodiment. The spincoater 200 includes a circular-shaped support member or table 202 which is driven to rotate at a desired rotational speed or rpm by a motor 203 which is disposed below and operatively connected with the support table 202. A plurality (four in the illustrated embodiment) of shaping members 204 each in the form of a segment (i.e., a partially cutaway circle), having a curved outer side surface and a straight inner side surface, are slidably mounted on the flat surface of the support table 202 circumferentially around the peripheral portion thereof for shaping the square substrate 201 into a circular configuration. The segmented shaping members 204 are slidable on the surface of the support table 202 in radial directions within a limited range.

A biasing means 205 is provided on each of the shaping members 204 for moving each shaping member 204 in a radially inward direction into intimate contact at its inner side with the corresponding side surface of the square substrate 201 when the support table 204 is rotated by the motor 203 at a speed greater than a predetermined reference level. The biasing means 205 comprises a thrust rod 206 and a weight 207. Each thrust rod 206 is disposed in and extends through a vertically extending radially elongated hole 202a which is formed through the support table 202 at a location corresponding to the central portion of each shaping member 204. The thrust rod 206 is pivotally supported on the support table 202 for swinging motion about a fulcrum 206a in a vertical, diametrical plane. The thrust rods 206 are each engaged at their upper end with an engagement recess in the lower surface of the corresponding shaping member 204. Each weight 207, being slightly heavier than the shaping members 204, is attached to the corresponding thrust rod 206 at its lower end. When the support table 202 is rotated by the motor 203, the weights 207 and the shaping members 204 are subjected to centrifugal forces to cause the thrust rods 206 to pivot about the fulcrums 206a and their upper ends being moved radially inwards. By that pivoting of the thrust rods 206, the shaping members 204 are forced radially inwards so that they are brought into intimate contact at their inner side surfaces with the corresponding lateral side surfaces of the square substrate 201. Thus, the shaping members 204 abut the substrate 201 and form a continuously extending circular-shaped flat surface with it.

A level adjusting means 208 is also provided on each shaping member 204 for adjusting the level or the upper surface thereof to be flush with the surface of the substrate 201 mounted on the support table 202. In the embodiment illustrated in FIGS. 4 and 5, the level adjusting means 208 each comprise a group (four in the illustrated embodiment) of adjusting screws. The screws are threaded into the corresponding shaping member 204 in a symmetric relation with respect to the associated thrust rod 206 to abut at their lower ends against the upper surface of the support table 202. By turning each group of adjusting screws 208 in the clockwise or counterclockwise direction, the level of each shaping member 204 is raised or lowered relative to the upper surface of the support table 202 whereby the upper surface of each shaping member 204 can be adjusted to be flush with the upper surface of the substrate 201 on the support table 202.

A damping member 209 is secured to the inner surface of each shaping member 204 so that the impact forces applied by the shaping members 204 to the lateral side surfaces of the substrate 201 upon abutment thereof against the substrate 201 are elastically absorbed or damped by the damping member 209 to prevent resultant damage or breakage of the substrate 201. The damping members 209 are each formed of an elastic material such as rubber, a synthetic resin such as teflon, or the like.

A mounting means is provided for fixedly mounting the substrate 201 on the support table 202 so that the substrate 201 can be rotated together with the support table 202. The mounting means comprises an annular suction groove 210a formed in the upper surface of the support table 202 in a concentric relation therewith, a pair of diametrical suction grooves 210b formed in the upper surface of the support table 202 and intersecting with each other at the center of the support table 202, the diametrical suction grooves 210b being connected at their opposite ends with the annular suction groove 210a, a vertical through-hole 210c vertically formed through the support table 202 at the center thereof and connected at its upper end with the diametrical suction grooves 210b at their intersection, and a connection tube 210d connecting between the lower end of the vertical through-hole 210c and an unillustrated vacuum source. With this construction, once the substrate 201 has been mounted in position on the support table 202, an unillustrated control valve in the connection tube 210d is opened so that air between the substrate 201 and the support table 202 is drawn out and discharged through the annular and diametrical suction grooves 210a and 210b, the vertical through hole 210c and the connection tube 210d into the unillustrated vacuum source to fixedly secure the substrate 201 to the upper surface of the support table 202 under the action of suction forces acting therebetween.

In operation, the non-circular or square-shaped substrate 201 is mounted in position on the support table 202 in a concentric relation therewith and then fixedly secured under suction to the upper surface of the support table 202 by the mounting means. Thereafter, the shaping members 204 are moved vertically by the adjusting means 208 so that the upper surfaces of the shaping members 204 are adjusted to be flush with the upper surface of the substrate 201. Subsequently, the motor 203 is operated to drive the support table 202 so that the shaping members 204 are moved radially inwards by the thrust means 205 into intimate contact at their inner side surfaces with the corresponding lateral side surfaces of the square substrate 201 to form a flat continuously extending circular-shaped surface in cooperation with the upper surface of the substrate 201. In this state, a coating material such as photoresist is dropped onto the upper surface of the substrate 201 at its central portion so that it spreads radially outwards along the flat continuously extending circular-shaped surface under the action of centrifugal forces. In this manner, the upper surface of the substrate 201, though not circular in itself, can be efficiently coated with the coating material to form a uniform coat of a uniform thickness over the entire surface thereof including corners thereof. The surface of the coat thus formed on the substrate 201 involves substantially no surface irregularities.

Here, it is to be noted that due to the fact that the shaping members 204 can be placed in intimate contact through damping means 209 with the side surfaces of the substrate 201 irrespective of the rotational speed or rpm of the support table 202, the surface of the substrate 201 can be coated uniformly and efficiently with a coating material under various coating conditions such as, for example, manufacturing errors in dimensions of the substrate 201, varying rotational speeds of the support table 202, varying viscosity of a coating material and the like.

Although in the above-described embodiment, the substrate 201 takes the form of a square, it will be readily understood that the present invention can be applied to a substrate of any configuration including a generally non-circular configuration such as a triangle, a rectangle, parallelogram a trapezoid, a polygon, a partially cutaway circle, a sector and the like. In this case, it is necessary to appropriately modify the configuration of each shaping member 204 in such a manner that the shaping members 204 conform at their inner side surfaces to the peripheral side surfaces of the substrate and cooperate at their upper surfaces with the upper surface of the substrate to form a flat continuously extending circular-shaped surface.

What is claimed is:

1. An apparatus for coating a substrate with a coating material comprising:
   means for applying a coating material to a substrate having a flat surface and a non-circular periphery, the coating being applied to the flat surface;
   a support table;
   mounting means for fixedly mounting the substrate having a flat surface and a non-circular periphery on said support table;
   drive means for rotating said support table;
   a plurality of shaping members slidably mounted on and sliding along said support table for engaging the non-circular periphery of the substrate mounted on said support table and for thereby forming, together with the non-circular substrate, a circularly shaped surface;

biasing means provided for biasing said slidably mounted shaping members into contact with the non-circular periphery of the substrate mounted on said support table; and level adjusting means for adjusting the levels of the slidable shaping members relative to said support table so that said shaping members are flush with the flat surface of the substrate mounted on said support table.

2. A coating apparatus according to claim 1 wherein said shaping members each are in the form of a segment having a curved outer side surface and a straight inner surface.

3. A coating apparatus according to claim 1 wherein said biasing means comprises:

a thrust rod extending through and pivotally supported on said support table for pivoting in a plane, said thrust rod having opposed first and second ends, said first end connected to one of said shaping members; and a weight connected to said thrust rod at said second end thereof, said weight being heavier than the shaping member connected to the first end of said thrust rod, said weight pivoting said thrust rod to move the shaping member toward said substrate mounted on said support table when said support table is rotated.

4. A coating apparatus according to claim 1 wherein said level adjusting means comprises a plurality of adjusting screws threadedly engaging a shaping member and bearing on said support table.

5. A coating apparatus according to claim 1 wherein said means for applying comprises a roll coater for coating the flat surface of the substrate with a roller.

6. A coating apparatus according to claim 1 wherein said mounting means comprises vacuum means disposed between said substrate and said support table for urging a substrate onto the support table.

7. A coating apparatus according to claim 6 wherein said vacuum means comprises:

grooves formed in said support table;

a through-hole formed through said support table at the center thereof and connected with said grooves; and a vacuum source connected with said through-hole.

* * * * *